United States Patent [19]

Werner, Jr. et al.

[11] Patent Number: 5,270,660

[45] Date of Patent: Dec. 14, 1993

[54] ELECTROSTATIC VOLTMETER EMPLOYING HIGH VOLTAGE INTEGRATED CIRCUIT DEVICES

[75] Inventors: Alan J. Werner, Jr., Rochester, N.Y.; Mohamad M. Mojaradi, Los Angeles, Calif.; Guillermo Lao, Hawthorne, Calif.; Dale Sumida, Los Angeles, Calif.; Mostafa R. Yazdy, Los Angeles, Calif.; Harry J. McIntyre, Los Angeles, Calif.; Mehrdad Zomorrodi, Thousand Oaks, Calif.

[73] Assignee: Xerox Corporation, Stamford, Conn.

[21] Appl. No.: 878,658

[22] Filed: May 5, 1992

[51] Int. Cl.$^5$ .................. G01R 29/12; G01R 5/28; G01N 27/60

[52] U.S. Cl. ..................... 324/457; 324/72; 324/452; 324/458

[58] Field of Search .............. 324/72, 72.5, 452–458, 324/109, 123 R

[56] References Cited

U.S. PATENT DOCUMENTS

| | | | |
|---|---|---|---|
| 3,667,036 | 5/1972 | Seachman | 324/72 |
| 3,852,667 | 12/1974 | Williams et al. | 324/72 |
| 3,921,087 | 11/1975 | Vosteen | 330/2 |
| 4,027,240 | 5/1977 | Meade | 324/110 |
| 4,061,983 | 12/1977 | Suzuki | 330/207 P |
| 4,149,119 | 4/1979 | Buchheit | 324/32 |
| 4,270,090 | 5/1981 | Williams | 324/457 |
| 4,330,749 | 5/1982 | Eda et al. | 324/457 |
| 4,797,620 | 1/1989 | Williams | 324/458 |
| 4,804,922 | 2/1989 | Sometani et al. | 324/457 |
| 4,853,639 | 8/1989 | Vosteen et al. | 324/457 |
| 4,868,907 | 9/1989 | Folkins | 323/231 |
| 4,878,017 | 10/1989 | Williams | 324/109 |
| 4,973,910 | 11/1990 | Wilson | 324/457 |

FOREIGN PATENT DOCUMENTS 0090564 4/1987 Japan ................... 324/457

*Primary Examiner*—Gerard R. Strecker
*Attorney, Agent, or Firm*—Duane C. Basch

[57] ABSTRACT

An electrostatic measurement apparatus for generating a modified electrical signal in proportion to an electrostatic potential present on a surface. The apparatus includes a sensor for producing a signal representative of the electrostatic potential on the surface. The apparatus also includes high-voltage and low-voltage devices combined to produce an amplifier which transforms the sensor signal into a low-voltage signal indicative the surface potential. The electrostatic measurement apparatus is implemented using high-voltage and low-voltage integrated circuit technology.

29 Claims, 6 Drawing Sheets

ELECTROSTATIC VOLTMETER EMPLOYING HIGH VOLTAGE INTEGRATED CIRCUIT DEVICES

This invention relates generally to the measurement of electrostatic potentials, and more particularly to an apparatus for reliably measuring an electrostatic potential.

CROSS REFERENCE

The following related applications are hereby incorporated by reference for their teachings:

"Dynamic Limiting Circuit for an Amplifier," Alan J. Werner, Jr. et al., application Ser. No. 07/878,654, now U.S. Pat. No. 5,204,636 (Common Assignee), filed concurrently herewith;

"An Integrated Linear Ultra High Voltage Device," M. Mojaradi et al., application Ser. No. 07/878,651 (Common Assignee), filed concurrently herewith; and "An Integrated Ultra Low Leakage High Voltage Protection Circuit," M. Mojaradi et al., application Ser. No. 07/878,581 (Common Assignee), filed concurrently herewith.

BACKGROUND OF THE INVENTION

The present invention is a device capable of measuring electrostatic potentials with insignificant current flow into the input of the device. Generally, such devices include a probe or sensor assembly working in conjunction with an associated voltmeter assembly which receives the signals from the probe and produces an output signal. Subsequently, the output signal may be used to drive an indicator, or to control an electrostatic process as a function of the measured electrostatic potential. Thus, the features of the present invention may be used in the printing arts and, more particularly, in an electroreprographic system to control a xerographic process. These electrostatic voltmeters, or ESVs, are particularly well suited for measuring photoreceptor surface charge, which in turn allows for the automated adjustment of machine characteristics to achieve high quality reprographic output.

Heretofore, it has been recognized that the sensing probe or electrode must be modulated, with respect to the field being measured in order to accurately measure the field. Moreover, two methods of achieving the required modulation of the electrode are known, the first requiring a stationary electrode and a vibrating element, or vane, to modulate the field which reaches the electrode, as described by U.S. Pat. No. 3,921,087 to Vosteen (Issued Nov. 18, 1975), or by U.S. Pat. No. 4,149,119 to Buchheit (Issued Apr. 10, 1979). The second approach utilizes a moving electrode, affixed to the end of a vibrating element as disclosed in U.S. Pat. No. 3,852,667 to Williams et al. (Issued Dec. 3, 1974), or alternatively as disclosed in U.S. patent application Ser. No. 07/848,563, now U.S. Pat. No. 5,212,451, by A. Werner filed on Mar. 9, 1992.

The ESV may also utilize an "ion probe" similar to that disclosed by Williams in U.S. Pat. No. 4,270,090 (Issued May 26, 1981) to produce a signal representative of the potential on the surface being characterized.

Moreover, numerous approaches are recognized to process the signal produced by the sensing electrode, thereby enabling the measurement of the electrostatic field potential. Some signal processing approaches are illustrated in the following disclosures which may be relevant:

U.S. Pat. No. 3,667,036; Patentee: Seachman; Issued: May 30, 1972

U.S. Pat. No. 4,027,240; Patentee: Meade; Issued: May 31, 1977

U.S. Pat. No. 4,061,983; Patentee: Suzuki; Issued: Dec. 6, 1977

U.S. Pat. No. 4,149,119; Patentee: Buchheit; Issued: Apr. 10, 1979

U.S. Pat. No. 4,330,749; Patentee: Eda et al.; Issued: May 18, 1982

U.S. Pat. No. 4,853,639; Patentee: Vosteen et al.; Issued: Aug. 1, 1989

U.S. Pat. No. 4,797,620; Patentee: Williams; Issued: Jan. 10, 1989

U.S. Pat. No. 4,804,922; Patentee: Sometani et al.; Issued: Feb. 14, 1989

U.S. Pat. No. 4,868,907; Patentee: Folkins; Issued: Sep. 19, 1989

U.S. Pat. No. 4,878,017; Patentee: Williams; Issued: Oct. 31, 1989

U.S. Pat. No. 4,973,910; Patentee: Wilson; Issued: Nov. 27, 1990

The relevant portions of the foregoing patents may be briefly summarized as follows:

U.S. Pat. No. 3,667,036 to Seachman discloses electrometer amplifier circuits for measuring the potential of the electrostatic charge formed on an insulating surface. The circuit includes a probe assembly consisting of probe and guard electrodes. The output of the probe electrode is connected to a high impedance circuit which comprises a Metal Oxide Field Effect Transistor (MOS FET) in a source-follower configuration.

U.S. Pat. No. 4,027,240 to Meade discloses a voltmeter used in detecting an electronic voltage signal in an ordinance firing circuit, where the voltmeter is protected by a pair of back-to-back parallel-connected limiting diodes. A first limiter is used to reduce the amplitude of the detected signal, while the second limiter prevents overloading of an indicator.

U.S. Pat. No. 4,061,983 to Suzuki discloses a transistor amplifier including a bipolar transistor supplied with an input signal and a field effect transistor (FET) which is directly connected to an output electrode of the bipolar transistor to amplify the applied signal. A protective circuit senses the load impedance and activates a voltage signal which ultimately results in the lowering of the gate potential on the FET to prevent the FET from damage.

U.S. Pat. No. 4,149,119 to Buchheit teaches an electrostatic voltmeter or electrometer which includes a probe sensor for sensing electrostatic charge present on a test surface. The probe sensor is modulated using a rotating vane or shutter arrangement. The probe is also conditioned to receive both A.C. and D.C. signals which are amplified by a D.C. amplifier, where the A.C. signal from the probe is fed back to the D.C. amplifier to stabilize its output.

U.S. Pat. No. 4,330,749 to Eda et al. teaches an electrometer apparatus for measuring the electrostatic potential on the surface of a photoconductive drum. The apparatus consists of an electrode which is placed near the surface on which the electrostatic potential is to be measured. A potential proportional to the surface potential is induced in the electrode and applied to the input of an amplifier with high input impedance. The amplifier has a MOSFET input stage with a high input impedance and a low bias current.

U.S. Pat. No. 4,853,639 to Vosteen et al. discloses a non-contacting type electrometer apparatus for monitoring the electric potential of a test surface. A sensing integrator is used in conjunction with a pre-amp and a high-gain operational amplifier (opamp) to provide an improved high-frequency response.

U.S. Pat. No. 4,797,620 to Williams discloses a non-contacting electrostatic detector which eliminates the use of high-voltage circuitry in non-space dependent, high-voltage electrostatic monitoring devices. An A.C. voltage, having the same frequency as the modulator frequency, is used to produce a zero net current flow, so that the magnitude and phase of the output signal are proportional to the magnitude and polarity of the electrostatic potential being monitored.

U.S. Pat. No. 4,804,922 to Sometani et al. and U.S. Pat. No. 4,868,907 to Folkins both disclose devices which proportionally convert electrostatic voltage into current.

U.S. Pat. No. 4,878,017 to Williams teaches a non-contacting electrostatic voltage follower having a response speed independent of the frequency of modulation of the capacitance or electrostatic field between a detector electrode and the measured surface. The voltage follower is capable of following both static and dynamic characteristics of an external field or potential to be measured.

U.S. Pat. No. 4,973,910 to Wilson teaches an electrostatic analyzer that incorporates a field effect transistor (FET) as a sensor used to convert electrostatic voltage into a proportional current. The sensor is described as a semiconductive device having n-p-n junctions. In operation, a zero-field reference is used to alter the base potential of the sensor, thus forming a zero-field condition. The surface potential difference is then determined as a function of the sensor base voltage, which is directly measured by a voltmeter.

The present invention includes an electrostatic voltmeter design that employs high-voltage components provided on a single integrated circuit, thereby reducing the need for discrete components in the fabrication of electrostatic voltmeters. By providing the high-voltage components on a single integrated circuit, the performance and reliability of the components are also improved. Furthermore, the high-voltage integrated circuit components may be utilized in both contacting and non-contacting electrostatic voltmeters.

In accordance with the present invention, there is provided an apparatus for generating a modified low voltage electrical signal in proportion to an electrostatic potential present on a surface. The apparatus includes a sensor for producing a voltage signal representative of the electrostatic potential on the surface, a high-voltage source potential, and a high-voltage circuit which is connected to the sensor and the high-voltage potential, so that a current signal proportional to the difference between the surface potential and the high-voltage source potential is produced. The apparatus also includes an amplifier, connected to the output of the high-voltage circuit, for transforming the current signal output by the high-voltage circuit into a low voltage signal indicative of the test surface potential.

The present invention will be described in connection with preferred embodiments, however, it will be understood that there is no intent to limit the invention to the embodiments described. On the contrary, the intent is to cover all alternatives, modifications, and equivalents as may be included within the spirit and scope of the invention as defined by the appended claims.

DESCRIPTION OF THE PREFERRED EMBODIMENT

Figure 1:
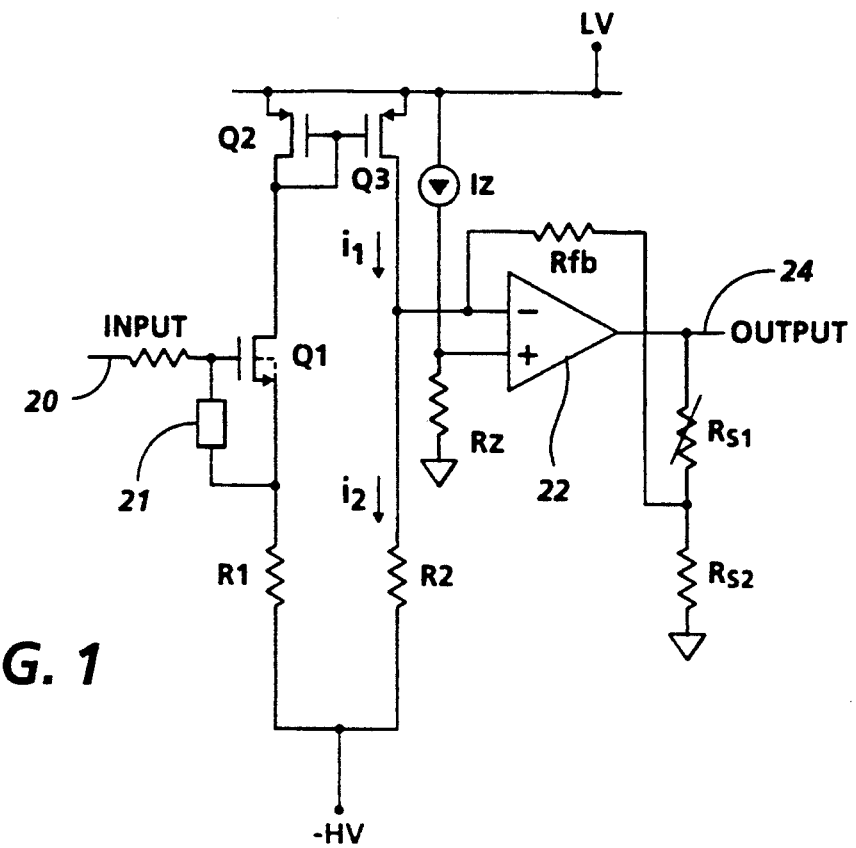
FIG. 1 is a schematic illustration of the electrical components common to each embodiment of the present invention.

For a general understanding of the electrostatic voltmeter of the present invention, reference is made to the drawings. In the drawings, like alphanumeric reference characters have been used throughout to designate identical elements. FIG. 1 shows a simplified electrical circuit that is employed in the contacting and non-contacting electrostatic voltmeter embodiments. NMOS FET Q1 is a high-voltage depletion-mode NMOS driver which operates in the range of from about 0 volts to at least $-1700$ volts. Also included with the NMOS FET is protection device 21 which is capable of withstanding an electrostatic discharge voltage of approximately 2 Kv. NMOS FET Q1 and its associated protection scheme are further described in a related application for "An Integrated Linear Ultra High Voltage Device," by Mojaradi et al., Ser. No. 07/878,651, filed concurrently herewith, and previously incorporated herein by reference. In the present embodiment, high-voltage resistors R1 and R2 are 7.69M$\Omega$ resistors which are capable of operating over a voltage range of at least 0 to $-1200$ volts. Furthermore, R1 and R2 are purposefully designed to track one another over the range of ESV operating temperatures. Generally, the high-voltage resistors may be thin-film integrated circuit resistors as described in pending U.S. patent application, Ser. No. 07/513,697, by Lao et al., filed Apr. 24, 1990, the relevant portions of which are hereby incorporated by reference.

Figure 4B:
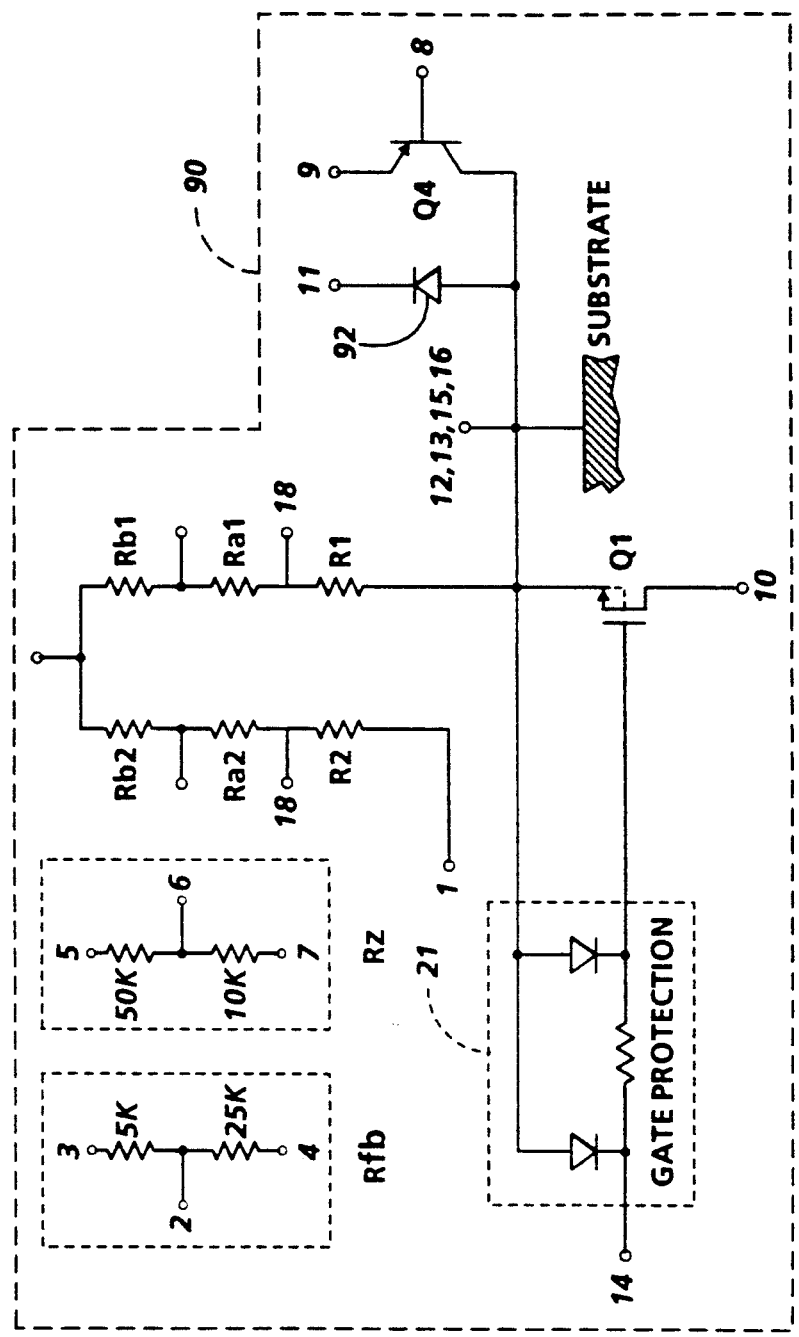
FIGS. 4A and 4B illustrate, respectively, the integrated circuit package and pin-out diagram for the high-voltage integrated circuit components of the present invention.

In operation, a high voltage in the range of about $-1200$ volts is detected by a sensor (not shown) and supplied to the circuit of FIG. 1 via input line 20. NMOS FET Q1, in conjunction with high-voltage resistor R1, form a source-follower, where the current through the source-follower is a measure of the voltage difference between the gate of Q1 (or input voltage) and the high-voltage power supply potential, $-HV$. It should be noted that the embodiment depicted in FIG. 1 is a "floating" configuration, as described by copending application for "An Integrated Linear Ultra High Voltage Device," by Mojaradi et al., Ser. No. 07/878,651, where the high-voltage components float with the substrate as indicated in FIG. 4B. The high-voltage power supply, depicted by $-HV$, may be any suitable power supply capable of providing a potential somewhat more negative than the most negative voltage being measured but within the device ratings, about $-1700$ volts, although the device is typically operated to measure voltages of about $-1200$ volts. The maximum current required from the high-voltage power supply is determined by the parallel resistance of R1 and R2 and is less than 500 $\mu A$ for the typical operating range. Because the current required from the high-voltage source is low, a scorotron grid may be used as the source of the high-voltage reference potential as described by Folkins in U.S. Pat. No. 4,868,907 (Issued Sep. 19, 1989), the relevant portions of which are hereby incorporated by reference.

Figure 8:
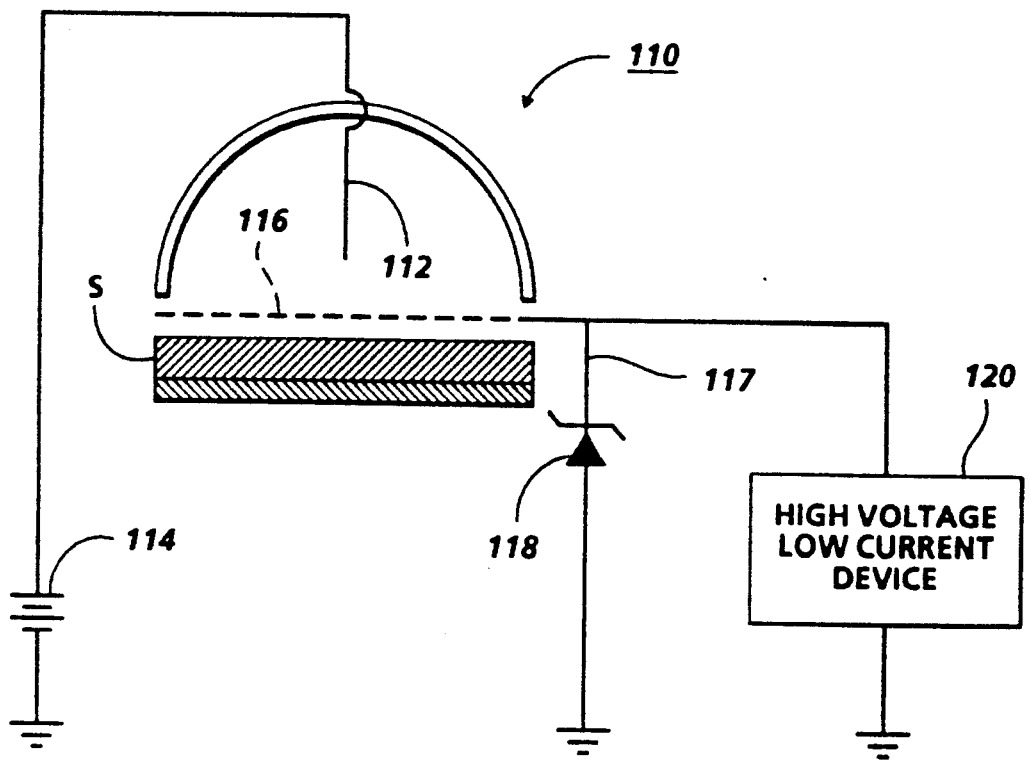
FIG. 8 is a schematic drawing demonstrating the use of a self-biased scorotron grid as a power supply for a low current, high voltage electrostatic voltmeter.

FIG. 8 demonstrates the use of a corona generating device such as a self-biased scorotron grid as the power source for a low current, high voltage requirement device, preferably an electrostatic voltmeter. Accordingly, scorotron 110 for charging a photoreceptor surface S is provided with a coronode 112 such as a pin array or wire, driven to corona producing voltages with high voltage DC power supply 114. A conductive member or grid 116 is interposed between surface S and coronode 112 for the purpose of controlling the charge deposited on surface S. To maintain the desired voltage level on grid 116, which is selected to be the voltage level desired on surface S, grid 116 is connected to a ground potential via ground line 117 including a current sinking device such as Zener diode 118. The Zener diode is selected with a breakdown voltage equal to the voltage desired at the grid. Of course, various combinations of current sink devices could be used to similar effect.

In accordance with the invention, a low current, high voltage requirement device 120, for example the electrostatic voltmeter of the present invention, may be driven from the scorotron grid by connection to the ground line 117 thereof. Depending upon the voltage desired across device 20, the device may be connected to the ground line 117 between any current sinking device 118 and the grid, or, with the selection of multiple current sinking devices 118, device 120 may be connected along the ground line 117 between devices 118 having different voltage drops there across, to selectively obtain a desired voltage. The grid current produced by a typical pin scorotron device is about 1.5 milliamps. In an alternative embodiment, which one skilled in the art would no doubt appreciate from the description herein, a corotron is in certain cases provided with a conductive shield which is self biased to a selected voltage. In such a case, the conductive shield may be used as the low current, high voltage source in substitution for the field. For the self biasing feature, and thus, the inventive power supply, to be operative, a substantial DC component is required.

Also, matched transistors Q2 and Q3 form a 1:1 current mirror, where the current from transistor Q3, $i_1$, tracks the current in transistor Q2, which in turn is the current from NMOS FET Q1. At the same time current $i_2$, in high-voltage resistor R2, is a measure of the high-voltage power supply. Therefore, the difference between the current from resistor R2 and from transistor Q3, or $i_1 - i_2$, is an accurate measure of the input voltage on line 20. Since this difference current $(i_1 - i_2)$ is supplied by the amplifier via resistor Rfb, the output of amplifier 22 is also a measure of the input voltage. More specifically, the NMOS FET Q1 and current mirror system Q2-Q3 have translated the high voltage input to a low voltage output at ground potential while maintaining the very high input impedance required by ESVs, and without any need for a low-voltage power supply floating at a voltage approximately equal to the electrostatic potential being measured.

By making the R1, R2, and Rfb resistor ratios track very tightly over the operating temperature range for the circuit, approximately 0° C. to 50° C., the voltage output by amplifier 22 on line 24 accurately and reliably traces that of the input voltage present on input line 20 over that range. The basic circuit illustrated in FIG. 1 also includes a zero circuit represented by current Iz flowing through resistor Rz, thus shifting the output range off zero. Note that as with resistor Rfb, the response of resistor Rz to temperature changes must closely track the responses of high-voltage resistors R1 and R2. A standard span adjustment circuit, including span resistors Rs1 and Rs2, is connected between the output of amplifier 22 and ground. The span adjustment circuit requires that the parallel resistance of Rs1 and Rs2 must be much less than Rfb. In addition, it is highly desirable to fabricate R1, R2, Rz and Rfb on the same high-voltage integrated circuit. Alternatively, an external matched network of thin film resistors could be used for R1, R2, Rz and Rfb.

As another alternative, and as would be commonly known, the current mirror systems employed in the embodiments hereby described may be replaced by appropriate operation amplifier-resistor systems. However, it is also important to note that such a substitution would introduce considerably more complexity into the ESV circuits illustrated for each of the respective embodiments.

Figure 2:
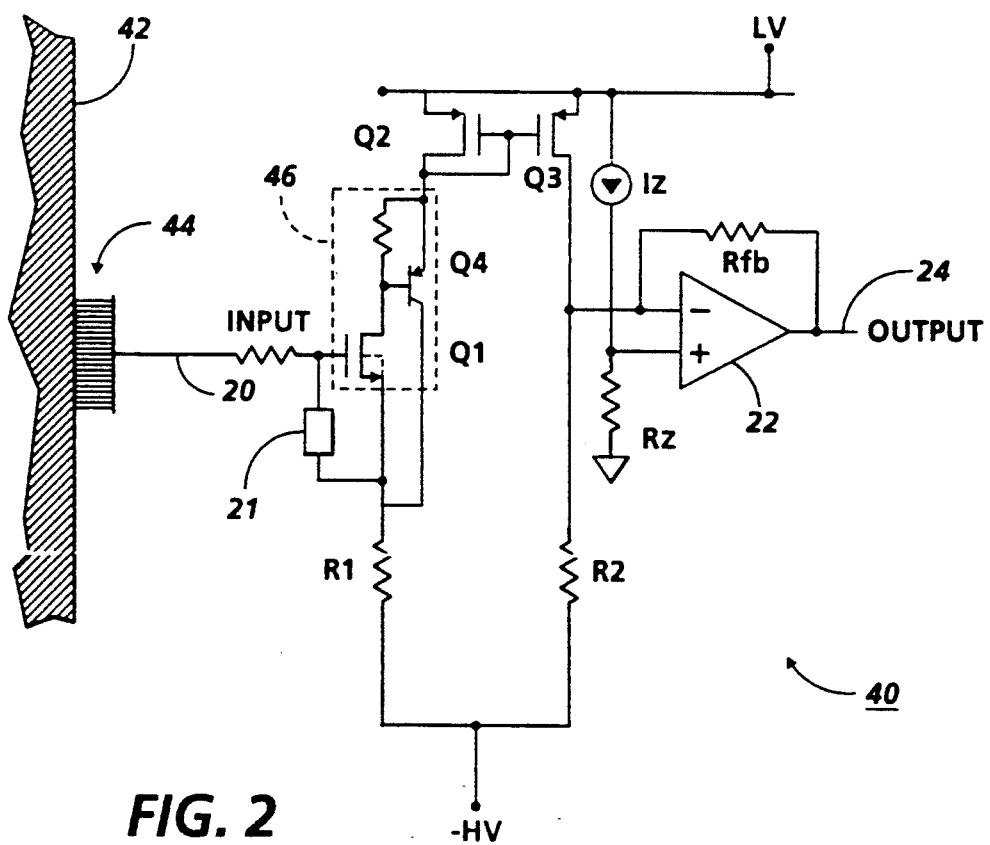
FIG. 2 is an electrical schematic showing the circuitry associated with a contacting electrostatic voltmeter embodiment of the present invention.

Referring next to FIG. 2, which shows the details of contacting electrostatic voltmeter 40, where an insulating surface 42, which may be a photoconductive member or similar member suitable for maintaining a charge thereon, is contacted by a conductive member 44. Ideally, conductive member 44 is capable of coupling with the electrostatic potential present on surface 42, without depleting the potential or redistributing any pattern of charge present thereon. In one embodiment, member 44 may be an ion probe as described by Williams in U.S. Pat. No. 4,270,090 (Issued May 26, 1981), the relevant portions of which are hereby incorporated by reference, where an ionic current flow is produced in response to the potential to be measured. In another embodiment, conductive member 44 may be a brush similar to that described in U.S. patent application Ser. No. 07/795,563 by Swift et al., filed on Nov. 21, 1991, now U.S. Pat. No. 5,220,481, the relevant portions of which are hereby incorporated by reference. As disclosed by Swift et al. the carbon fibers within the brush, originally formed as a pultruded composite, act as a suitable path for the charge contacted by the brush on surface 42. The fibers would be combined at a common connection 20 which is the input to contacting electrostatic voltmeter 40. When the carbon fibers of the brush are insulated from one another, as disclosed by Swift et al., the effective parallel fiber contact exhibits a high electrical resistance, generally above $5 \times 10^8 \Omega$ cm, and there is no redistribution, or smearing, of the image. However, when there is no concern for redistribution of the charge on the photoconductive surface, for example, immediately after a charging operation and before exposure, a lower resistance brush contact, without insulated fibers, may be utilized.

In addition to the contacting member, FIG. 2 also shows the addition of a high-voltage PNP transistor, Q4, which is very useful for the contacting ESV. Transistor Q4 is a high-voltage substrate PNP, capable of operating over a range of from about 0 volts to at least $-1250$ volts, although typically at potentials of approximately $-1200$ volts. The fabrication of a high-voltage transistor similar to Q4 is described in U.S. patent application Ser. No. 07/722,736 by Vo et al., filed Jun. 27, 1991, abandoned, the relevant portions of which are hereby incorporated by reference. In the contacting type ESV, high voltage PNP transistor Q4 enables the compound Darlington amplifier configuration, 46, using transistors Q1 and Q4. The high common emitter current gain ($\beta \approx 100$) of Q4, effectively bootstraps the source of Q1 so that the voltage change across the gate-to-source of the high-voltage NMOS FET, Q1, is minimized, thereby minimizing the effective input capacitance of circuit 40.

Figure 3:
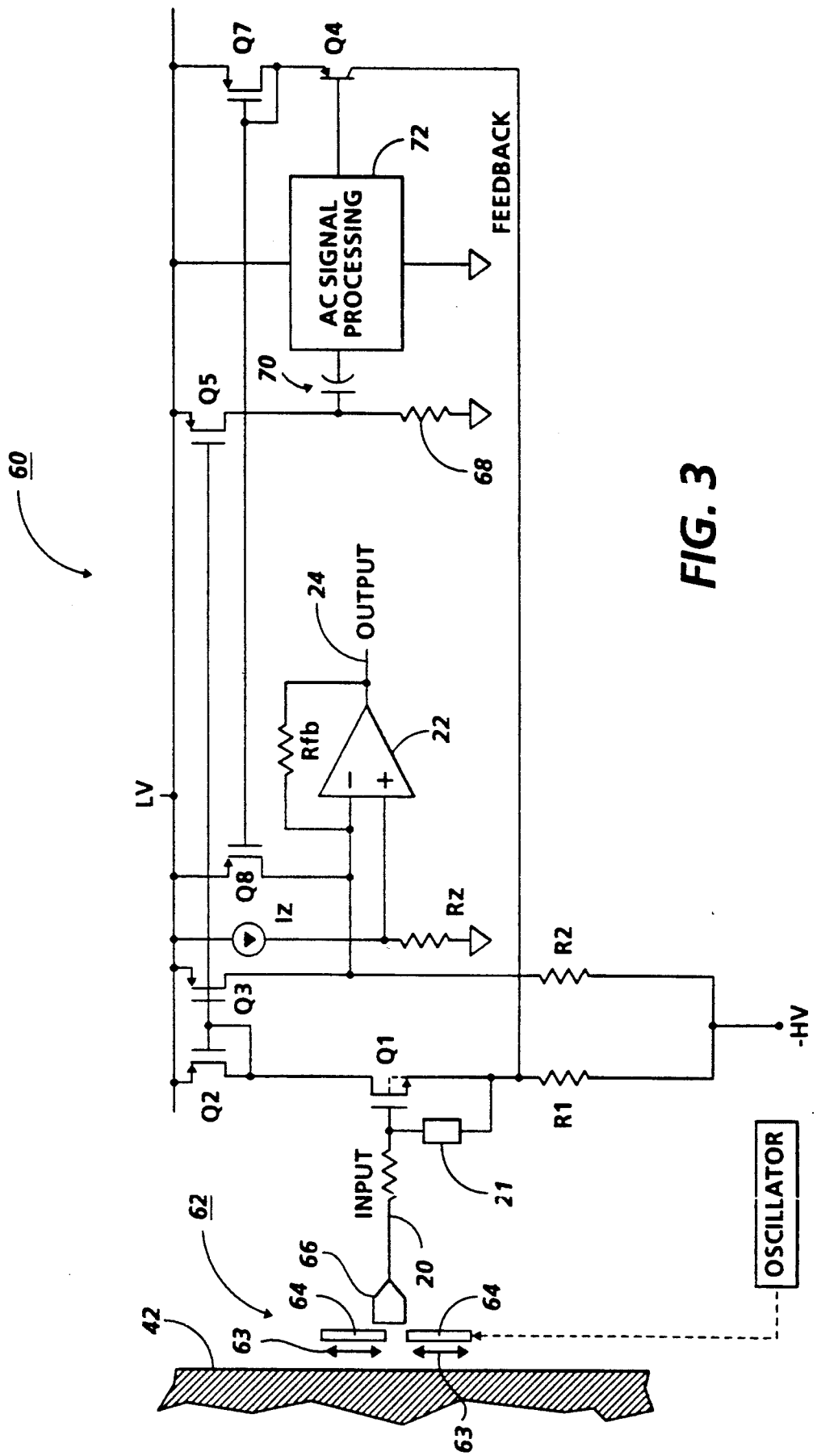
FIG. 3 is an electrical schematic showing the circuitry associated with a non-contacting electrostatic voltmeter embodiment of the present invention.

Referring now to FIG. 3, which shows the details of non-contacting electrostatic voltmeter 60, a modulator 62 having vanes 64, or similar sensor occluding mechanisms vibrating in the direction of arrows 63 is used to modulate the signal received by sensor electrode 66. In operation, modulator 62 periodically occludes the exposure of sensor electrode 66 with respect to the electrostatic field present on the surface of insulating surface 42. As is commonly known for non-contacting ESVs, the signal from sensor electrode 66 is actually generated by physically modulating the capacitive coupling between electrode 66 and surface 42, such as a photoreceptor. While one modulation method is illustrated in FIG. 3, numerous approaches are known to achieve the modulation of the capacitive coupling relationship. For example, the single-beam modulator described in U.S. patent application Ser. No. 07/848,563 by Werner, filed Mar. 9, 1992, the relevant portions of which are hereby incorporated by reference, would provide suitable modulation of the sensor electrode. This modulation causes a modulated voltage to be generated at the gate of the NMOS field-effect transistor, or input line 20 of the circuit.

In the non-contacting embodiment of FIG. 3, it is important to note that the current through resistor R1 is now supplied by two sources, high-voltage NMOS FET Q1, and high-voltage PNP transistor Q4. The NMOS FET is designed to be "slightly" depletion mode, for example, Vgs is approximately equal to zero volts, and it has a small amount of current passing through it, thereby making it "active." Thus the modulation of the signal at the gate of transistor Q1 causes the current through the high-voltage NMOS FET to also be modulated.

Another distinction between the non-contacting ESV of FIG. 3 and the previously described embodiments is the addition of transistor Q5 to the current mirror system Q2-Q3, such that transistor Q5 feeds resistor 68 and is coupled via capacitor 70 to, or "DC decoupled" from, AC Signal Processing block 72. The alternating current (AC) portion of the signal, for example, the portion due to the modulation of sensor electrode 66, is processed in a manner commonly known for ESVs which utilize a modulated sensor arrangement. Generally, the alternating current portion of the signal is amplified, demodulated, and integrated by block 72. Note, also, that the NMOS FET Q1 and mirror system Q2-Q5 effectively shifts this AC signal processing to ground potential. In addition, AC Signal Processing block 72 may utilize a dynamically limited amplifier similar to that disclosed in the U.S. patent application for a "Dynamic Limiting Circuit for an Amplifier," by Werner et al., Ser. No. 07/878,654, filed concurrently herewith, and previously incorporated herein by reference.

Subsequent to processing, the integrated signal is output from block 72 and fed to the base of PNP transistor Q4 which supplies its collector current to resistor R1, thereby providing the high voltage direct current (DC) feedback necessary to make the source (and gate) of the NMOS FET, Q1, track the DC value of the input signal being modulated. The output signal is derived exactly as described with respect to the previous embodiments, with the exception that now the current through resistor R1 is supplied both by high-voltage NMOS FET Q1 and PNP transistor Q4, such that current mirror Q2-Q3 feeds the NMOS FET current to the summing node of amplifier 22 and current mirror Q7-Q8 feeds the emitter, and thus the collector current, of PNP transistor Q4. It should be noted that the current mirror system shown has been simplified for purposes of illustration, and that the actual current mirror system which is employed in the non-contacting ESV embodiment is considerably more complex, although commonly known to one skilled in the art. For example, the current mirror includes, among other features, means for compensating for the base current of PNP transistor Q4.

While not specifically illustrated, the low-voltage components described in the contacting and non-contacting ESV embodiments, including current mirror Q2-Q3 and amplifier 22, would be provided on one low-voltage IC implemented using a 5 volt CMOS process. The low-voltage IC also has a Min/Max circuit which tracks and holds either the minimum or maximum value of the voltage measured at output 24 in the previously described embodiments. Selection of Min/Max is made via a single digital input signal, select, while resetting of the Min/Max is also via a digital signal, reset. Both digital signal inputs, select and reset, are "open collector" compatible and have internal pull-up resistors operatively associated therewith. Furthermore, both the normal "continuous" output, line 24, and the Min/Max output are buffered and are capable of driving up to 10 nF of capacitance load.

Figure 4A:
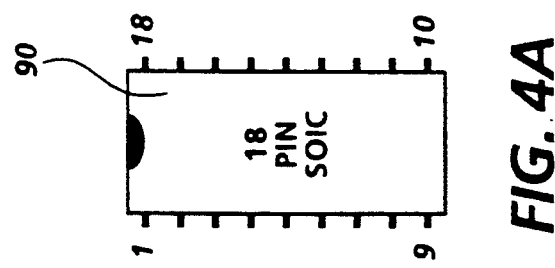

As shown in FIGS. 4A and 4B, the high-voltage components of the ESV are included on a single integrated circuit (IC), 90, containing the high-voltage NMOS FET Q1 and high voltage PNP transistor Q4. Also included on the IC are a high voltage diode, 92, which may be used in the non-contacting ESV, and the critically tracking resistors R1, R2, Rfb, and Rz. While not described in conjunction with the previous embodiments, high-voltage IC 90 also includes tapping resistor pairs Ra1, Ra2 and Rb1, Rb2, each of which have resistances of about 190Ω. The additional resistors would enable tapping at different points to modify the total resistance associated with R1 and R2.

The low-voltage IC (not shown) and high-voltage IC 90, along with supporting resistors and capacitors may be mounted on a single ceramic hybrid substrate. Power for the low-voltage components is taken from a 24 v power supply (not shown) and an internal shunt regulator on the low-voltage IC controls the low-voltage power. On the other hand, the high-voltage power is taken from the scorotron grid power supply, as previously described with respect to FIG. 1.

Figure 5:
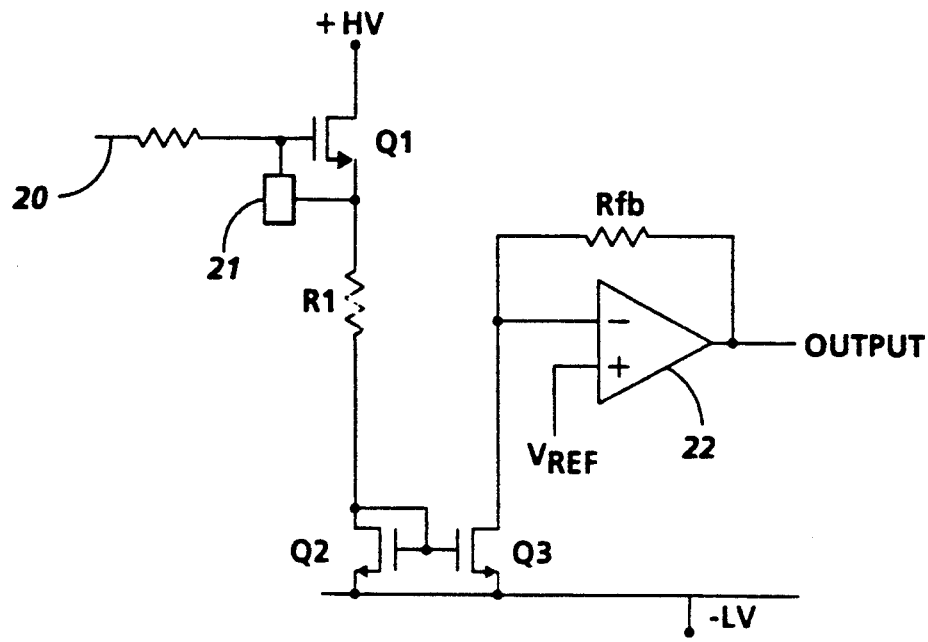
FIG. 5 is an electrical schematic illustrating an alternative, positive sensing, contacting electrostatic voltmeter embodiment of the present invention.

Referring now to FIG. 5, which shows an alternative embodiment for a contacting ESV, NMOS FET Q1 is used to produce a positive voltage sensing ESV. Q1 is again connected as a source follower, but now the drain is connected to the high-voltage source while resistor R1 is essentially referenced to ground so that the source (and drain) current of Q1 is a measure of the gate voltage, or the input voltage. Thus, the need for the parallel high-voltage legs of the circuit in FIG. 1 are eliminated. As before, the current mirror formed by transistors Q3 and Q2 "mirrors" the source current to the non-inverting input of amplifier 22. This current is again supplied by the output of the amplifier via Rfb, so that the output voltage of amplifier 22 is a measure of the input voltage at 20.

Figure 6A:
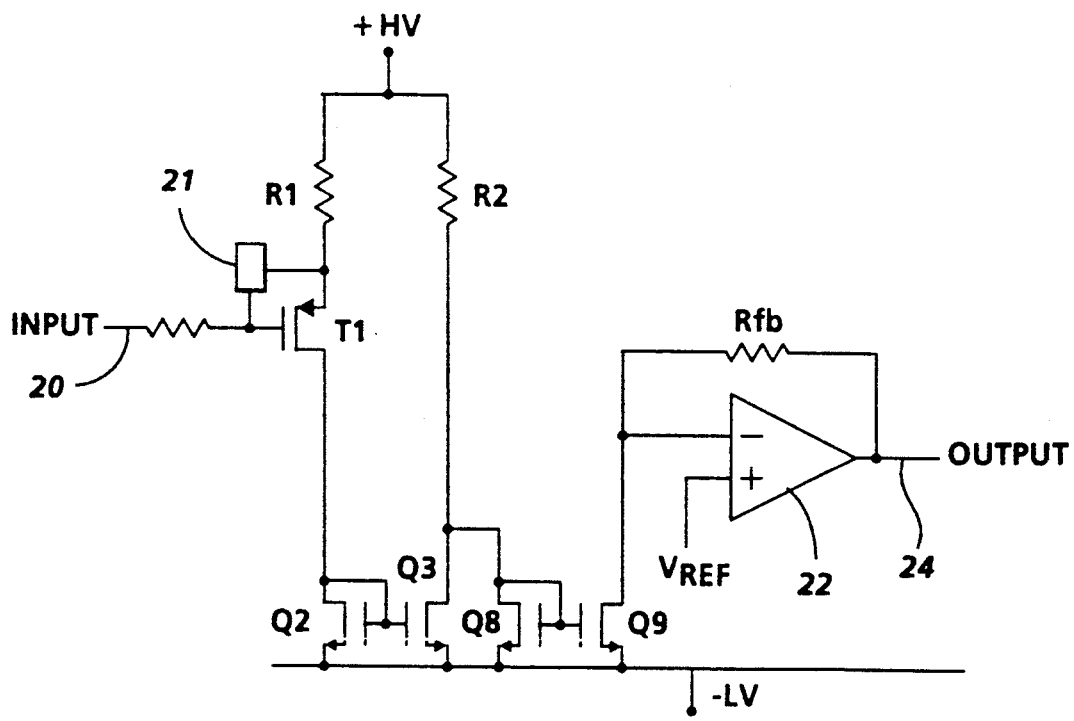
FIGS. 6A and 6B are electrical schematics respectively illustrating both contacting and non-contacting type, positive sensing electrostatic voltmeter embodiments employing a high voltage p-type metal-oxide semiconductor field-effect transistor (PMOS FET)
Figure 6B:
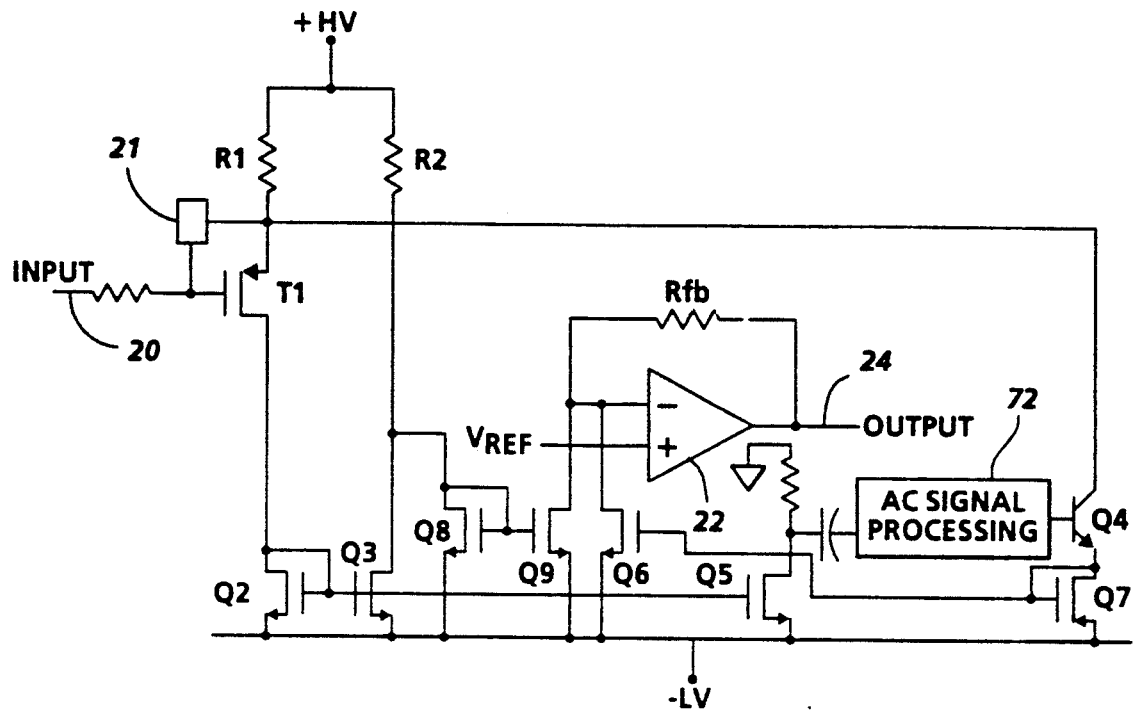

In the additional alternative embodiments shown in FIGS. 6A and 6B, a high-voltage, p-type metal-oxide semiconductor field effect transistor (PMOS FET) may be employed to implement positive voltage sensing contacting and non-contacting electrostatic voltmeters, respectively in the same manner as that used by NMOS FET based circuit of FIG. 1 to measure negative potentials. In FIGS. 6A and 6B, the high-voltage PMOS FET is indicated by reference numeral T1. In the contacting ESV shown in FIG. 6A, a pair of current mirrors, Q2-Q3 and Q8-Q9, are used to generate the current which is input to the amplifier, 22. As previously described, a reference potential, $V_{REF}$ is applied to the positive input of the amplifier. Although not shown, the reference voltage would be produced using a zeroing circuit as previously described. Applied to the negative input of amplifier 22 is the representative current, produced as a function of the difference between the input potential on line 20 and the potential of +HV. Once again, the signal output from amplifier 22, provided on line 24, is a characterization of the difference in potential and may be used for measurement of the input potential.

Similar to the previously described non-contacting ESV of FIG. 3, the positive sensing, non-contacting ESV of FIG. 6B includes devices suitable for processing the modulated (AC) signal provided on input line 20. As NMOS FET Q1 of FIG. 3 is utilized to receive the input from a modulated sensor, so PMOS FET T1 is used in the positive potential sensing embodiment of FIG. 6B. Also, two current mirroring transistor systems, Q2-Q3-Q8-Q9 and Q6-Q7, are once again used to produce the representative current input to amplifier 22. Further included are the additional devices necessary to process the modulated signal in the same manner as previously described with respect to FIG. 3, including AC Signal Processing block 72 and transistors Q4, Q5, Q6, and Q7.

Figure 7:
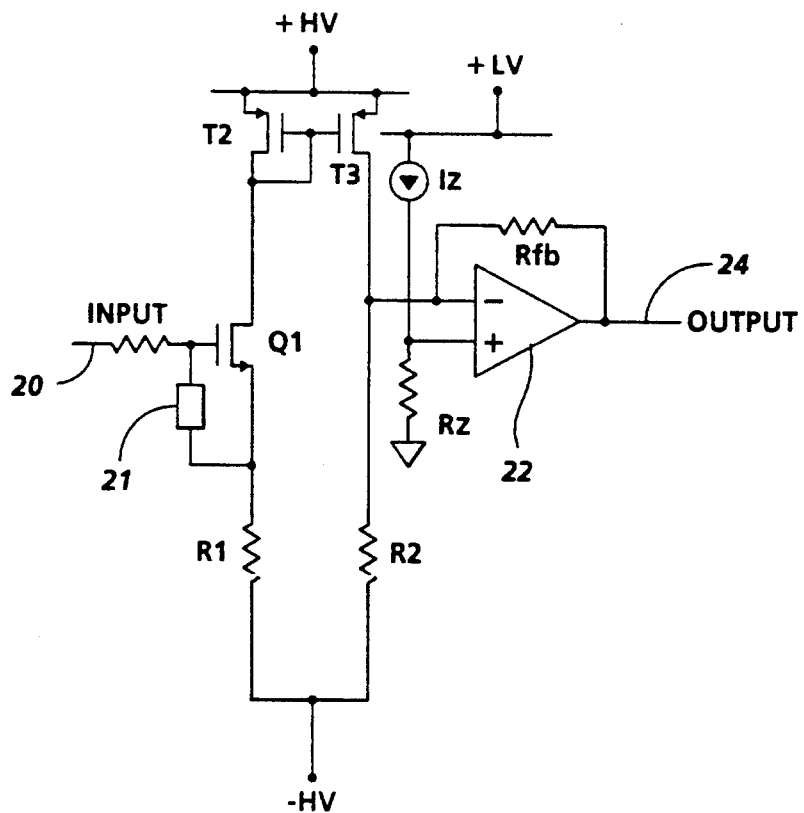
FIG. 7 is an electrical schematic illustrating another alternative embodiment of an electrostatic voltmeter circuit employing two high voltage PMOS FETs to enable the characterization of both positive and negative input potentials.

Referring, lastly, to the schematic illustration of FIG. 7, which shows the basic components of a dual polarity electrostatic voltmeter circuit, high-voltage NMOS FET Q1 is used to interface to the input signal provided on line 20, while high-voltage PMOS FETs T2 and T3 are used to produce the current mirror. The behavior of the circuit is the same as that previously described with respect to FIG. 1, where a current is produced in the second leg of the circuit, and applied to the negative input of amplifier 22, in response to the difference between the input potential and the high-voltage source. However, the present embodiment utilizes a high-voltage p-channel current mirror which can be connected to the +HV source, thus allowing the input signal to vary over almost the entire range between the two high-voltage supplies, +HV to −HV.

In recapitulation, the present invention is an electrostatic voltmeter circuit suitable for use in either a contacting or non-contacting, positive or negative potential sensing, type electrostatic voltmeter. The invention enables a flexible, low cost electrostatic voltmeter to be produced using a high-voltage integrated circuit in the overall design. The invention further provides a system that enables high-voltage sensing and high-voltage feedback in such a manner that all signal processing is done at low voltages and at ground potential, thereby eliminating the need for "floating" low voltage power supplies which are typical of electrostatic voltmeters.

It is, therefore, apparent that there has been provided, in accordance with the present invention, an apparatus for efficiently and reliably producing a signal representative of the potential of an electrostatic field on an insulating surface. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

We claim:

1. An apparatus for generating an electrical signal proportional to an electrostatic potential on a surface, comprising:

sensing means for producing a voltage signal representative of the electrostatic potential on the surface;

a high-voltage source adapted to produce a first potential having a polarity the same as the electrostatic potential and a magnitude greater than that of the electrostatic potential;

a high-voltage sensing circuit, including:

a source-follower connected to said high-voltage source and said sensing means so as to regulate a source-follower current signal passing therethrough as a function of the voltage signal produced by said sensing means; and a current mirror, including a first leg and a second leg, said first leg being connected to said source-follower to receive the source-follower current signal and to produce a second current signal on the second leg of said current mirror as a function of the source-follower current signal;

a second power source adapted to drive said current mirror; and a transimpedance amplifier, connected to the second leg of said current mirror, for transforming the second current signal produced by said high-voltage circuit into a voltage signal indicative of the electrostatic potential on the surface.

2. The apparatus of claim 1, wherein said source-follower comprises:
a high-voltage MOS FET, having a source, a drain and a gate thereon and protection means associated therewith, the gate being connected to said sensing means so as to regulate the current passing from the source to the drain; and
a first resistor connected, in series between the source of said high-voltage MOS FET and said high-voltage source, wherein a source-follower current, $i_1$, passing through the source-follower, is regulated as a function of the voltage difference between the electrostatic potential on the surface and the first potential.

3. The apparatus of claim 2, wherein the high-voltage MOS FET is an n-type MOS FET.

4. The apparatus of claim 3 wherein said high-voltage sensing circuit further includes a high-voltage p-n-p transistor coupled to the high-voltage n-type MOS FET to form a compound Darlington amplifier therewith, said high-voltage p-n-p transistor having a base connected to the drain of said n-type MOS FET, an emitter connected to the first leg of said current mirror, and a collector connected to the source of said n-type MOS FET, said high-voltage p-n-p transistor thereby minimizing variation of the gate-to-source voltage of the high-voltage n-type MOS FET.

5. The apparatus of claim 4 wherein said components of the high-voltage sensing circuit are contained on a single integrated circuit.

6. The apparatus of claim 2, wherein the high-voltage MOS FET is a p-type MOS FET.

7. The apparatus of claim 6 wherein said high-voltage sensing circuit further includes a high-voltage n-p-n transistor coupled to the high-voltage p-type MOS FET to form a compound Darlington amplifier therewith, said high-voltage n-p-n transistor having a base connected to the drain of said p-type MOS FET, an emitter connected to the first leg of said current mirror, and a collector connected to the source of said p-type MOS FET, said high-voltage n-p-n transistor thereby minimizing variation of the gate-to-source voltage of the high-voltage p-type MOS FET.

8. The apparatus of claim 7 wherein said components of the high-voltage sensing circuit are contained on a single integrated circuit.

9. The apparatus of claim 2, wherein said high-voltage sensing circuit further includes a second resistor, coupled in series between said high-voltage source and the second leg of said current mirror, said second resistor having a current, $i_2$, passing therethrough, where said $i_2$ current is a function of the high-voltage source potential.

10. The apparatus of claim 9 wherein the transimpedance amplifier further includes:
an inverting input connected to the second leg of said current mirror; and
a feedback circuit having a feedback resistor, connected in series between an output of said transimpedance amplifier and the inverting input thereof;
wherein the first resistor, the second resistor, and the feedback resistor are formed on a common substrate so that the resistances thereof track one another over an operating temperature range.

11. The apparatus of claim 10 wherein the first resistor and the second resistor are high-voltage resistors suitable for handling potentials of at least 1200 volts.

12. The apparatus of claim 1, wherein the high-voltage source comprises:
a corona generating device including a coronode;
a DC power supply adapted to drive the coronode to a corona producing potential;
a conductive member adjacent the coronode, the conductive member including a self-biasing arrangement to control the voltage produced thereon by a corona current from the coronode, the self-biasing arrangement including a current sinking device connecting the conductive member to a ground potential; and
a high-voltage reference takeoff electrically coupled to the conductive member and the current sinking device so as to control the source potential with the current sinking device.

13. The apparatus of claim 12, wherein the high-voltage source has a potential of at least 1200 volts.

14. The apparatus of claim 1, wherein the apparatus is capable of measuring electrostatic potentials on the test surface of at least 1200 volts.

15. The apparatus of claim 1, wherein the sensing means is in electrical contact with the surface.

16. The apparatus of claim 15, wherein the sensing means comprises an ion probe suitable for establishing electrical contact with the surface using a stream of charged ions.

17. The apparatus of claim 15, wherein the sensing means is also in mechanical contact with the surface.

18. The apparatus of claim 17, wherein the sensing means comprises:
a plurality of continuous strand fibers, each fiber having a high electrical resistance, so as to avoid redistributing the electrostatic potential contained on the surface during contact therewith; and
a thermally stable insulating component interposed between the fibers forming a brush, said brush extending from said insulating component into contact with the surface.

19. The apparatus of claim 18, wherein said continuous strand fibers are formed as a pultruded composite.

20. The apparatus of claim 17, wherein the sensing means comprises a plurality of continuous strand fibers, each of said fibers having a low electrical resistance.

21. The apparatus of claim 20, wherein said continuous strand fibers are formed as a pultruded composite.

22. The apparatus of claim 2, wherein said sensing means is spaced apart from the surface and produces a modulated current signal, and where the apparatus further comprises low-voltage to high-voltage feedback means, connected to the high-voltage sensing circuit, for providing a feedback current thereto, said feedback means including:
signal processing means for producing a low-voltage feedback signal as a function of the modulated current signal; and
means, connected to said signal processing means, for producing a feedback current in response to the low-voltage feedback signal, whereby said feedback current is supplied to the source of the high-voltage MOS FET.

23. The apparatus of claim 22, wherein said sensing means comprises:

a sensor, spaced from the surface and forming a capacitive coupling relationship therebetween; and means for modulating the capacitive coupling relationship between the sensor and the surface, so that the sensor produces a modulated current signal.

24. The apparatus of claim 22, wherein said feedback current producing means comprises a high-voltage bipolar transistor having a collector, a base and an emitter, said high-voltage bipolar transistor being connected to produce the feedback current at the collector thereof in response to the low-voltage feedback signal, said feedback current being supplied to the source of the high-voltage MOS FET.

25. The apparatus of claim 22, wherein said feedback current producing means comprises a second high-voltage MOS FET transistor having a drain, a gate and a source, said second high-voltage MOS FET transistor being connected to produce the feedback current at the drain thereof in response to the low-voltage feedback signal, said feedback current being supplied to the source of the high-voltage MOS FET.

26. The apparatus of claim 1 wherein:
said high-voltage source includes a negative high-voltage source, providing a negative source potential more negative than the largest negative potential present on the surface; and
said second power source includes a positive high-voltage source providing a positive potential more positive than the largest positive potential present on the surface to said current mirror.

27. The apparatus of claim 26 wherein:
said source-follower comprises
  a high-voltage NMOS FET having a source, a drain and a gate thereon and protection means associated therewith; and
  a first resistor connected, in series between the source of said high-voltage NMOS FET and said high-voltage source, where a current, $i_1$, passing through the source-follower amplifier is regulated as a function of the voltage difference between the electrostatic potential on the surface and the negative high-voltage source potential;
said current mirror comprises
  a pair of high-voltage PMOS FETs forming a balanced current mirror therebetween, the first high-voltage PMOS FET being connected between the source of the positive potential and the drain of the high-voltage PMOS FET, and the output of the second high-voltage PMOS FET being connected to the input of said transimpedance amplifier; and
further comprising a second resistor, coupled in series between the negative high-voltage source potential and the second leg of said current mirror, said second resistor having a current, $i_2$, passing therethrough, where said $i_2$ current is a function of the negative high-voltage source potential.

28. The apparatus of claim 26, wherein the sensing means comprises an ion probe suitable for establishing electrical contact with the surface using a stream of charged ions.

29. The apparatus of claim 10 wherein the transimpedance amplifier further includes a zeroing circuit, connected to a non-inverting input of said transimpedance amplifier, said zeroing circuit including a zeroing resistor formed on the common substrate so that the resistance thereof tracks the resistances of the first resistor, the second resistor, and the feedback resistor over the operating temperature range.

* * * * *